(12) United States Patent
Song

(10) Patent No.: US 11,402,622 B2
(45) Date of Patent: Aug. 2, 2022

(54) DISPLAY PANEL, METHOD FOR DRIVING THE SAME, AND DISPLAY DEVICE

(71) Applicants: Beijing BOE Display Technology Co., Ltd., Beijing (CN); BOE Technology Group Co., Ltd., Beijing (CN)

(72) Inventor: Wenshuai Song, Beijing (CN)

(73) Assignees: Beijing BOE Display Technology Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 523 days.

(21) Appl. No.: 16/478,315

(22) PCT Filed: Oct. 25, 2018

(86) PCT No.: PCT/CN2018/111964
§ 371 (c)(1),
(2) Date: Jul. 16, 2019

(87) PCT Pub. No.: WO2019/174240
PCT Pub. Date: Sep. 19, 2019

(65) Prior Publication Data
US 2021/0026131 A1 Jan. 28, 2021

(30) Foreign Application Priority Data

Mar. 14, 2018 (CN) .......................... 201810210885.6

(51) Int. Cl.
| | |
|---|---|
| *G02B 26/00* | (2006.01) |
| *G02B 26/02* | (2006.01) |
| *H01L 41/09* | (2006.01) |

(52) U.S. Cl.
CPC ........... *G02B 26/001* (2013.01); *G02B 26/02* (2013.01); *H01L 41/09* (2013.01)

(58) Field of Classification Search
CPC ...... G02B 26/001; G02B 26/02; G02B 1/005; G02B 5/201; H01L 41/09; G02F 2203/12;
(Continued)

(56) References Cited

U.S. PATENT DOCUMENTS

| | | | |
|---|---|---|---|
| 6,515,791 B1 * | 2/2003 | Hawwa ................. | G02B 26/02 359/323 |
| 2004/0001246 A1 | 1/2004 | Albu et al. | |

(Continued)

FOREIGN PATENT DOCUMENTS

| | | |
|---|---|---|
| CN | 1666137 A | 9/2005 |
| CN | 101191963 A | 6/2008 |

(Continued)

OTHER PUBLICATIONS

Machine Translation of WO-2012128408-A1 (Year: 2012).*

(Continued)

*Primary Examiner* — Darryl J Collins
*Assistant Examiner* — Matthew Y Lee
(74) *Attorney, Agent, or Firm* — ArentFox Schiff LLP; Michael Fainberg

(57) ABSTRACT

This disclosure discloses a display panel, a method for driving the same, and a display device. The display panel includes a first substrate and a second substrate arranged opposite each other, and a plurality of pixel elements located between the first substrate and the second substrate, where each of the plurality of pixel elements includes a photonic crystal light-modulating structure. The photonic crystal light-modulating structure can be configured to adjust an intensity of light emitted from the pixel element, so as to take the place of a liquid crystal layer in the prior art.

15 Claims, 5 Drawing Sheets

(58) Field of Classification Search
CPC .......... G02F 1/0131; G02F 1/0305; G02F 1/134309; G02F 1/21; G02F 2202/32; G02F 2203/15
See application file for complete search history.

(56) References Cited

U.S. PATENT DOCUMENTS

| | | | |
|---|---|---|---|
| 2004/0227455 A1* | 11/2004 | Moon | G02F 1/01 398/43 |
| 2012/0044443 A1* | 2/2012 | Han | G02B 6/005 349/106 |
| 2014/0078570 A1 | 3/2014 | Shim et al. | |
| 2014/0198373 A1 | 7/2014 | Ray | |
| 2019/0041694 A1 | 2/2019 | Li et al. | |
| 2019/0088215 A1 | 3/2019 | Qu et al. | |
| 2019/0146130 A1* | 5/2019 | Kwak | G02B 5/201 359/485.05 |

FOREIGN PATENT DOCUMENTS

| | | |
|---|---|---|
| CN | 20130092534 A | 8/2013 |
| CN | 103676397 A | 3/2014 |
| CN | 105093679 A | 1/2015 |
| CN | 105301860 A | 2/2016 |
| CN | 106066553 A | 11/2016 |
| CN | 106647015 A | 5/2017 |
| CN | 107123665 A | 9/2017 |
| CN | 107238968 A | 10/2017 |
| CN | 107561683 A | 1/2018 |
| CN | 108363249 A | 8/2018 |
| WO | WO-2012128408 A1 * | 9/2012 ....... G02F 1/133516 |

OTHER PUBLICATIONS

Office Action corresponding to Chinese Application No. 201810210885.6 dated Feb. 28, 2020.
Lu Xiaodong, "Application of photonic crystal materials in integrated optics and photovoltaics", Oct. 31, 2014.
Wang Qin et al." Basic Physics" China Medical Science and Technology Press, Sep. 30, 2002.
Songhao et al., "Photonics Technology and Application", Guangdong Science and Technology Press Anhui Science and Technology Press, Sep. 30, 2006.
Ma Qungang, "Principle and design of THT-LCD", Publishing House of Electronics Industry Beijing, Dec. 31, 2011.
Niu Jinhai, "Principles of Ultrasound and Biomedical Engineering Applied Biomedical Ultrasound", Jan. 13, 2017.
H.B Lebedev, UHF technology and devices (vol. 1) UHF technology, Oct. 31, 1965.

* cited by examiner

DISPLAY PANEL, METHOD FOR DRIVING THE SAME, AND DISPLAY DEVICE

CROSS REFERENCE

This application is a US National Stage of International Application No. PCT/CN2018/111964, filed on Oct. 25, 2018, designating the United States and claiming the priority of Chinese Patent Application No. 201810210885.6, filed with the Chinese Patent Office on Mar. 14, 2018, and entitled "A display panel, a method for driving the same, and a display device". The entire disclosure of each of the applications above is incorporated herein by reference.

FIELD

This disclosure relates to the field of display technologies, and particularly to a display panel, a method for driving the same, and a display device.

BACKGROUND

Liquid crystal displays (hereinafter "LCDs") has become predominant in the field of flat-panel displays. In an LCD, liquid crystal molecules between two sheets of electrically-conductive glass are driven to deflect by an electric field formed therebetween to display an image. However, the liquid crystal molecules may not resume their original state after they have deflected to a certain angle for a long time, resulting in an after-image which hinders the image from being displayed normally.

SUMMARY

An embodiment of this disclosure provides a display panel. The display panel includes a first substrate and a second substrate arranged opposite each other, and a plurality of pixel elements located between the first substrate and the second substrate, where each of the plurality of pixel elements includes a photonic crystal light-modulating structure.

In the display panel according to some implementation modes of the embodiment of this disclosure, each of the plurality of pixel elements further includes a plurality of sub-pixels in different colors. The photonic crystal light-modulating structure includes a first electrode layer, a second electrode layer, and a photonic crystal film between the first electrode layer and the second electrode layer. Material of the photonic crystal film includes piezoelectric material. And at least one of the first electrode layer and the second electrode layer includes a plurality of sub-electrodes, where the plurality of sub-electrodes are independent of each other and are arranged corresponding to the plurality of sub-pixels in a one-to-one manner.

In the display panel according to some implementation modes of the embodiment of this disclosure, the photonic crystal film includes a plurality of photonic crystal resonant cavities corresponding to the plurality of sub-pixels in a one-to-one manner.

In the display panel according to some implementation modes of the embodiment of this disclosure, each of the plurality of pixel elements includes a red sub-pixel, a green sub-pixel, and a blue sub-pixel. The plurality of photonic crystal resonant cavities include a red photonic crystal resonant cavity corresponding to the red sub-pixel, a green photonic crystal resonant cavity corresponding to the green sub-pixel, and a blue photonic crystal resonant cavity corresponding to the blue sub-pixel.

In the display panel according to some implementation modes of the embodiment of this disclosure, the piezoelectric material includes barium titanate, lead zirconate titanate, lead metaniobate, or lead barium solium lithium niobate.

In the display panel according to some implementation modes of the embodiment of this disclosure, each of the plurality of sub-pixels includes a corresponding color filter sheet located between the first substrate and the second substrate.

In the display panel according to some implementation modes of the embodiment of this disclosure, for each of the plurality of photonic crystal resonant cavities, a length of the photonic crystal resonant cavity is an integer multiple of a wavelength of light emitted from its corresponding sub-pixel.

In the display panel according to some implementation modes of the embodiment of this disclosure, for each of the plurality of photonic crystal resonant cavities, a length of the photonic crystal resonant cavity is an odd multiple of a half of a wavelength of light emitted from its corresponding sub-pixel.

In the display panel according to some implementation modes of the embodiment of this disclosure, the photonic crystal light-modulating structure is configured so that lengths of the plurality of photonic crystal resonant cavities are adjusted according to a difference in voltage between the first electrode layer and the second electrode layer.

In the display panel according to some implementation modes of the embodiment of this disclosure, the photonic crystal resonant cavities are annular photonic crystal resonant cavities.

According to some implementation modes of the embodiment of this disclosure, the display panel further includes a backlight source located on a side of the first or second substrate away from the pixel elements.

In the display panel according to some implementation modes of the embodiment of this disclosure, when the first electrode layer includes a plurality of sub-electrodes independent of each other and corresponding to the plurality of sub-pixels in a one-to-one manner, the second electrode layer is a planar electrode.

In the display panel according to some implementation modes of the embodiment of this disclosure, when the second electrode layer includes a plurality of sub-electrodes independent of each other and corresponding to the plurality of sub-pixels in a one-to-one manner, the first electrode layer is a planar electrode.

The embodiment of the disclosure further provides a display device. The display device includes the display panel according to the embodiment of this disclosure.

The embodiment of the disclosure further provides a method for driving the display panel. The method includes: determining intensities of light emitted from the plurality of pixel elements; and controlling the photonic crystal light-modulating structures so that the plurality of pixel elements emit the light at the determined intensities.

In the driving method according to some implementation modes of the embodiment of this disclosure, each of the plurality of pixel elements further includes a plurality of sub-pixels in different colors; the photonic crystal light-modulating structure includes a first electrode layer, a second electrode layer, and a photonic crystal film between the first electrode layer and the second electrode layer; material of the photonic crystal film includes piezoelectric material; at least one of the first electrode layer and the second electrode layer includes a plurality of sub-electrodes corresponding to the plurality of sub-pixels and arranged independent of each other; the photonic crystal film includes a plurality of photonic crystal resonant cavities corresponding to the plurality of sub-pixels in a one-to-one manner. Controlling the photonic crystal light-modulating structures so that the plurality of pixel elements emit light at the determined intensities includes: for each of the photonic crystal light-modulating structures: determining correspondence relationships between lengths of the plurality of photonic crystal resonant cavities included by the photonic crystal light-modulating structure and intensities of light emitted from the pixel element including the photonic crystal light-modulating structure; determining a difference in voltage between the first electrode layer and the second electrode layer included by the photonic crystal light-modulating structure according to the correspondence relationships; and applying a first voltage to the first electrode layer corresponding to the pixel element, and a second voltage to the second electrode layer corresponding to the pixel element, according to the difference in voltage between the first electrode layer and the second electrode layer, so that the pixel element emits light at the determined intensities.

DETAILED DESCRIPTION OF AN EMBODIMENT

Figure 1:
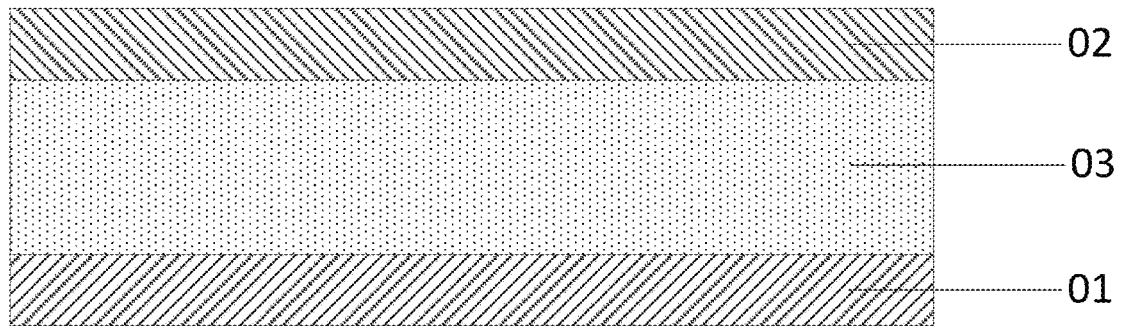
FIG. 1 is a first schematic diagram of structure of a display panel according to an embodiment of this disclosure.

In order to make the objects, the technical solutions, and the advantages of this disclosure more apparent, specific implementation modes of the display panel, the method for driving the same, and the display device according to an embodiment of this disclosure will be described below in details with reference to the drawings.

Thicknesses and shapes of each thin film in the drawings do not reflect real proportions in the array substrate, but are only intended for illustrating this disclosure.

As illustrated by FIG. 1, a display panel according to an embodiment of this disclosure includes a first substrate 01 and a second substrate 02 arranged opposite each other, and a plurality of pixel elements (only one pixel element is illustrated by FIG. 1 as an example) located between the first substrate 01 and the second substrate 02. Each of the plurality of pixel elements includes a photonic crystal light-modulating structure 03.

In the display panel according to the embodiment of this disclosure, by controlling the photonic crystal light-modulating structures arranged in the pixel elements, light intensities corresponding to the plurality of pixel elements are controlled, so that the photonic crystal light-modulating structures can take the place of the liquid crystal layer in the prior art to avoid the problem that the liquid crystal molecules may not resume their original state after they have deflected to a certain angle for a long time, resulting in an afterimage which hinders images from being displayed normally.

It shall be noted that photonic crystals are new optical material periodically distributed in space. A photonic crystal can modulate an electromagnetic wave having a corresponding wavelength. While the electromagnetic wave is being propagated in the photonic crystal structure, it is modulated due to Bragg scattering, energy of the electromagnetic wave forms an energy band structure, where energy bands are separated by band gaps, i.e., photonic band gaps, and all photons whose energy falls within the photonic band gaps cannot enter into the crystal. That is, only light at a certain frequency would be totally prohibited from being propagated in a photonic crystal having a certain periodic distance, and thus being transmitted out of the photonic crystal.

Figure 2:
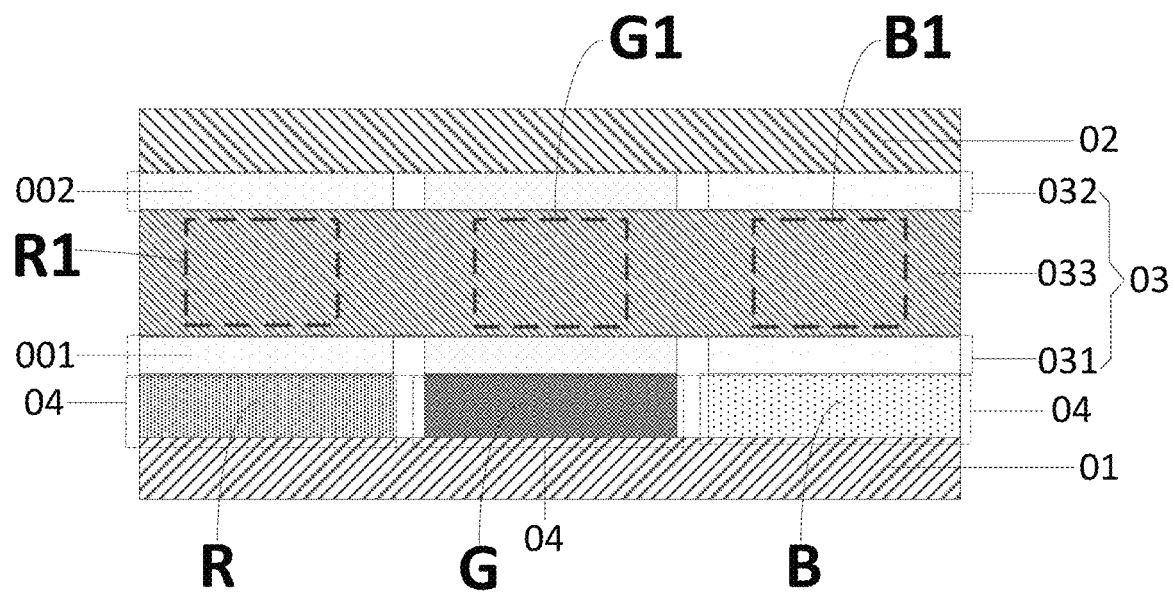
FIG. 2 is a second schematic diagram of structure of the display panel according to the embodiment of this disclosure.
Figure 3:
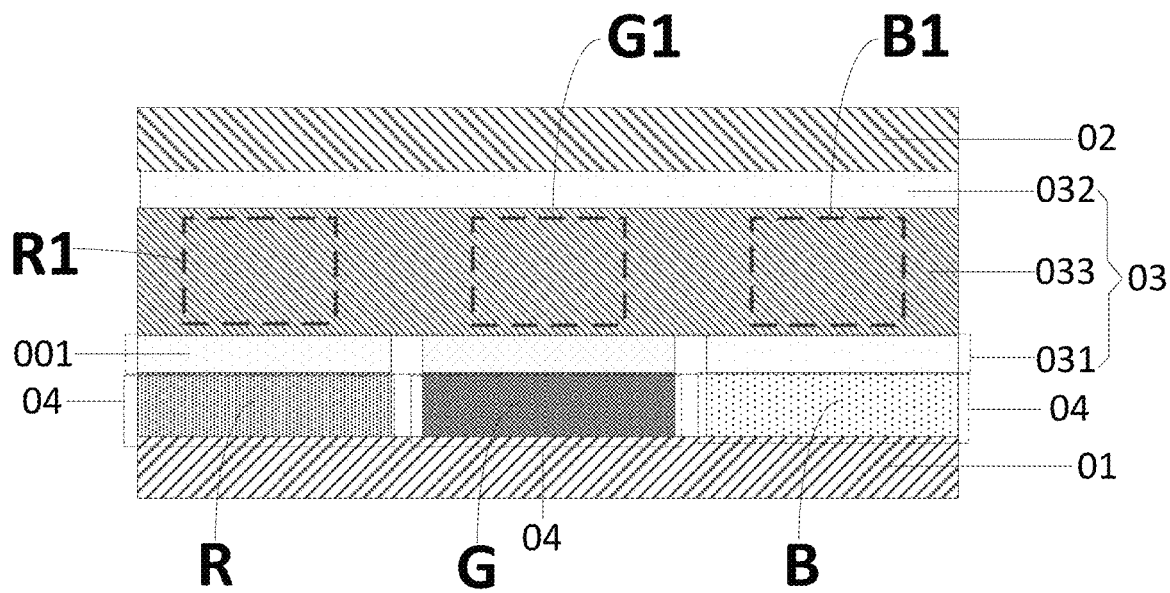
FIG. 3 is a third schematic diagram of structure of the display panel according to the embodiment of this disclosure.
Figure 4:
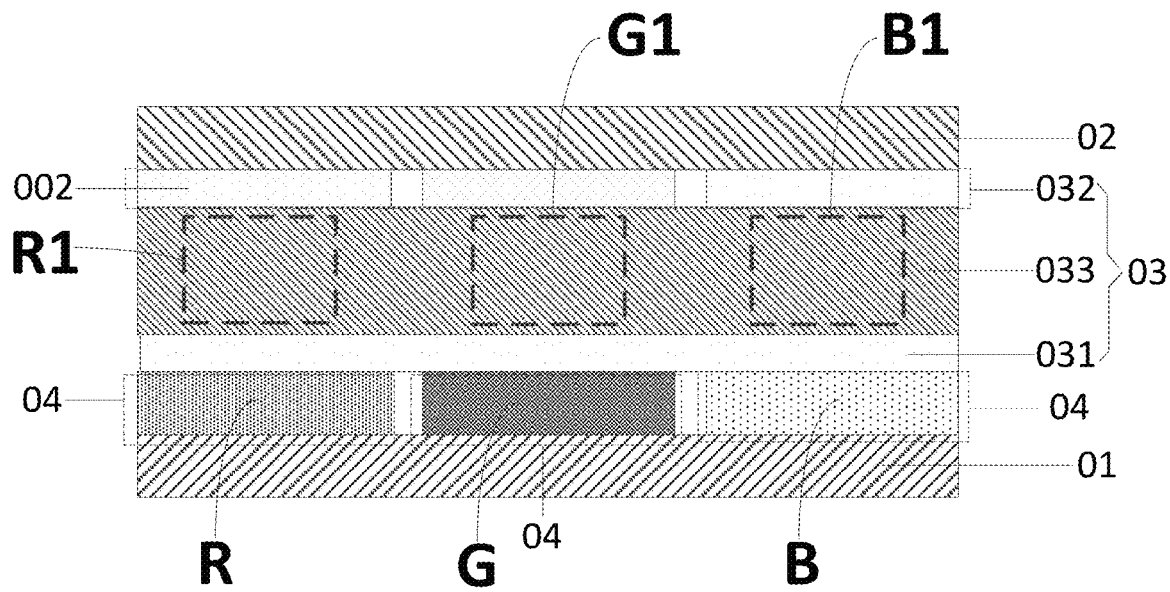
FIG. 4 is a fourth schematic diagram of structure of the display panel according to the embodiment of this disclosure.

In the display panel according to some implementation modes of the embodiment of this disclosure, such as those illustrated by FIG. 2 to FIG. 4, each of the plurality of pixel elements further includes a plurality of sub-pixels in different colors. The photonic crystal light-modulating structure 03 includes a first electrode layer 031, a second electrode layer 032, and a photonic crystal film 033 between the first electrode layer 031 and the second electrode layer 032.

Material of the photonic crystal film 033 includes piezoelectric material. At least one of the first electrode layer 031 and the second electrode layer 032 includes a plurality of sub-electrodes. The plurality of sub-electrodes are independent of each other, and are arranged corresponding to the plurality of sub-pixels in a one-to-one manner.

In the display panel according to some implementation modes of the embodiment of the disclosure, such as those illustrated by FIG. 2 to FIG. 4, the photonic crystal film 033 includes a plurality of photonic crystal resonant cavities corresponding to the plurality of sub-pixels in a one-to-one manner.

Structures of the resonant cavities are located in areas R1, G1, and B1 denoted by dotted boxes as illustrated, where R1, G1, and B1 are arranged corresponding to the sub-pixels, respectively. Particular structures of the resonant cavities and principles of light incidence and exit will be described below with reference to FIG. 5 and FIG. 6, so a detailed description thereof is omitted here. According to some implementation modes of the embodiment of this disclosure, the photonic crystal resonant cavities corresponding to the plurality of sub-pixels in a one-to-one manner are arranged in the photonic crystal film 033 to control intensities of light emitted from the plurality of sub-pixels.

Due to characteristics of photonic crystals (that only light at a certain frequency would be totally prohibited from being propagated in a photonic crystal having a specific periodic distance, and thus being transmitted out of the photonic crystal), the structures of the photonic crystal resonant cavities in the photonic crystal film can be configured to only transmit light in colors corresponding to the plurality of sub-pixels so that the photonic crystal film can control both the intensities and colors of the light emitted from the plurality of sub-pixels, so a color filter layer can be dispensed with to improve the transmittance of the display panel.

In the display panel according to some implementation modes of the embodiment of this disclosure, such as those illustrated by FIG. 2 to FIG. 4, each of the plurality of pixel elements includes a red (R) sub-pixel, a green (G) sub-pixel, and a blue (B) sub-pixel. The photonic crystal resonant cavities include a red photonic crystal resonant cavity R1 corresponding to the red sub-pixel R, a green photonic crystal resonant cavity G1 corresponding to the green sub-pixel and a blue photonic crystal resonant cavity B1 corresponding to the blue sub-pixel B. According to some other implementation modes, of course, each pixel element can further include sub-pixels in colors other than the above-mentioned three colors, where the photonic crystal resonant cavities further include photonic crystal resonant cavities in the other corresponding colors.

According to still another implementation mode of the embodiment of this disclosure, the piezoelectric material includes barium titanate, lead zirconate titanate, lead metaniobate, or lead barium solium lithium niobate, but is not limited thereto. Any material having a reverse piezoelectric effect falls within the scope of this disclosure, and a detailed description thereof is omitted here.

It shall be noted that the piezoelectric material has a reverse piezoelectric effect, where the reverse piezoelectric effect refers to that when an electric field is applied in a polarization direction of a dielectric, the dielectric is mechanically deformed or generates a mechanical stress in a specific direction, and when the electric field is removed, the deformation or the stress disappears.

Accordingly, in the display panel according to the embodiment of this disclosure, when voltage is applied to the first electrode layer and the second electrode layer, the photonic crystal film between the first electrode layer and the second electrode layer would be deformed, leading to change of the lengths of the resonant cavities in the photonic crystal film, that is, the lengths of the resonant cavities vary as the voltage varies, so that the intensities of the light emitted from the sub-pixels corresponding to the resonant cavities vary.

For example, when forming the red photonic crystal resonant cavity corresponding to the red sub-pixel, if the length of the red photonic crystal resonant cavity is an integer multiple of the wavelength of the light emitted from its corresponding red sub-pixel, the intensity of the light exiting the red photonic crystal resonant cavity is highest. When voltage is applied, the length of the red photonic crystal resonant cavity varies, so the intensity of the exiting light also varies. Accordingly, corresponding voltage can be applied according to intensities of exiting light in different colors so that intensities of the exiting light can be different.

Although the colors of the light emitted from the plurality of sub-pixels can be defined by configuration of the photonic crystal resonant cavities, for each sub-pixel, the color of the light emitted from the sub-pixel is defined by defining transmittance of the photonic crystal resonant cavity in terms of light in different colors. That is, the transmittance of the red photonic crystal resonant cavity in terms of red light is the highest, and the transmittance in terms of the blue and green light are extremely low, but a glimmer of the blue and green light may still be transmitted through the red photonic crystal resonant cavity, impacting displaying by the red sub-pixels.

Accordingly, in the display panel according to some implementation modes of the embodiment of this disclosure, such as those illustrated by FIG. 2 to FIG. 4, each sub-pixel includes a color filter sheet 04, and the plurality of color filter sheets 04 are located between the first substrate 01 and the second substrate 02. Namely the red (R) sub-pixel, the green (G) sub-pixel, and the blue (B) sub-pixel include red a color filter sheet, a green color filter sheet, and a blue color filter sheet, respectively, so that for each sub-pixel, light incident on the photonic crystal light-modulating structure corresponding to the sub-pixel is light corresponding to the sub-pixel, thus avoiding light in other colors impacting the color of light emitted from the sub-pixel and improving the contrast of the display panel.

It shall be noted that in the display panel according to the embodiment of this disclosure, when the plurality of color filters are located between the first substrate and the second substrate, the plurality of color filters can be located between the first substrate and the photonic crystal light-modulating structure, or the plurality of color filters can be located between the second substrate and the photonic crystal light-modulating structure, although the embodiment of this disclosure is not limited thereto.

Of course, each sub-pixel can also include a structure different from a color filter sheet through which light in a corresponding color can be transmitted, without departing from the scope of this disclosure.

According to some implementation modes of the embodiment of this disclosure, for each photonic crystal resonant cavity, the length of the photonic crystal resonant cavity is a multiple integer of a wavelength of light emitted from a sub-pixel corresponding to the photonic crystal resonant cavity. The length of the photonic crystal resonant cavity is a multiple integer of the wavelength of the light emitted from its corresponding sub-pixel when there is no difference in voltage between the first electrode layer and the second electrode layer, namely, the intensity of the light emitted from the sub-pixel is highest when the photonic crystal resonant cavity maintains its original length. For example, the length of the red photonic crystal resonant cavity is an integer multiple of the wavelength of red light, the length of the green photonic crystal resonant cavity is an integer multiple of the wavelength of green light, and the length of the blue photonic crystal resonant cavity is an integer multiple of the wavelength of blue light because the intensities of the emitted light are highest when the lengths of the resonant cavities are integer multiple(s) of the wavelengths of the light emitted from the corresponding sub-pixels. Therefore, the resonant cavities are formed so that the lengths of the photonic crystal resonant cavities corresponding to different colors are integer multiple(s) of the wavelengths of the light emitted from their corresponding sub-pixels.

In the display panel according to some implementation modes of the embodiment of this disclosure, for each photonic crystal resonant cavity, the length of the photonic crystal resonant cavity is an odd multiple of a half of a wavelengths of light emitted from a sub-pixel corresponding to the photonic crystal resonant cavity. For each photonic crystal resonant cavity, the length of the photonic crystal resonant cavity is an odd multiple of a half of the wavelengths of light emitted from its corresponding sub-pixel when there is a difference in voltage between the first electrode layer and the second electrode layer, and the intensities of light emitted from the sub-pixels are the lowest in such a situation.

In the display panel according to some implementation modes of the embodiment of this disclosure, the photonic crystal light-modulating structure is configured so that the lengths of the photonic crystal resonant cavities are adjusted according to a difference in voltage between the first electrode layer and the second electrode layer.

In the display panel according to the embodiment of this disclosure, when voltage is applied across the first electrode layer and the second electrode layer, the photonic crystal film between the first electrode layer and the second electrode layer is deformed, so the lengths of the resonant cavities in the photonic crystal film vary, namely the lengths of the resonant cavities vary as the voltage varies. For example, to form the red photonic crystal resonant cavity corresponding to the red sub-pixel, when the length of the red photonic crystal resonant cavity is an integer multiple of the wavelength of the light emitted from the sub-pixel corresponding to the red photonic crystal resonant cavity, the intensity of the light exiting the red photonic crystal resonant cavity is the highest, and when voltage is applied, the length of the red photonic crystal resonant cavity varies, so the intensity of the exiting light also varies. Accordingly, corresponding voltage can be applied according to the intensities of exiting light in different colors to obtain exiting light having different light intensities.

Figure 5:
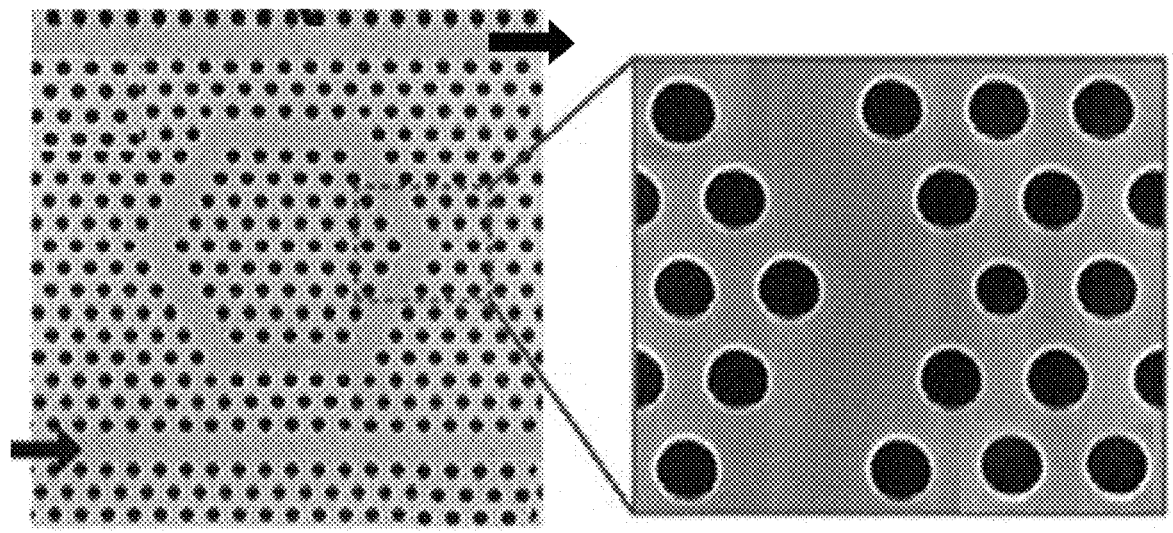
FIG. 5 is a schematic diagram of structure of a photonic crystal film according to the embodiment of this disclosure.

In the display panel according to some implementation modes of the embodiment of this disclosure, as illustrated by FIG. 5, the photonic crystal resonant cavities are annular photonic crystal resonant cavities. The annular photonic crystal resonant cavities are illustrated as hexagonal in FIG. 5 as an example. Of course, the annular photonic crystal resonant cavities can also be quadrilateral or octagonal, although they can be approximately circular for the best effect of emitting light because shapes such as the quadrilateral, hexagonal, octagonal, and etc., have sharp angles which may impact on the emission of light.

Thus in the display panel according to some implementation modes of the embodiment of this disclosure, the annular photonic crystal resonant cavities are circular photonic crystal resonant cavities.

In the display panel according to some implementation modes of the embodiment of this disclosure, the display panel further includes a backlight source located on a side of the first or second substrate away from the pixel elements.

In the display panel according to some implementation modes of the embodiment of this disclosure, the backlight source can be located on a side of the first substrate away from the pixel elements, and light is emitted from a side of the second substrate away from the first substrate. Or the backlight source can be located on a side of the second substrate away from the pixel elements, and light is emitted from a side of the first substrate away from the second substrate, although the embodiment of this disclosure is not limited thereto.

Stated otherwise, according to the embodiment of this disclosure, the photonic crystal light-modulating structures are arranged in place of the liquid crystal layer in the prior art, and the backlight source emits light, thus addressing the problem that the liquid crystal molecules may not resume their original states after they have deflected to a certain angle for a long time, resulting in an afterimage which hinders images from being displayed normally.

Working principles of this disclosure are described below in connection with the implementation mode illustrated by FIG. 2.

Figure 6:
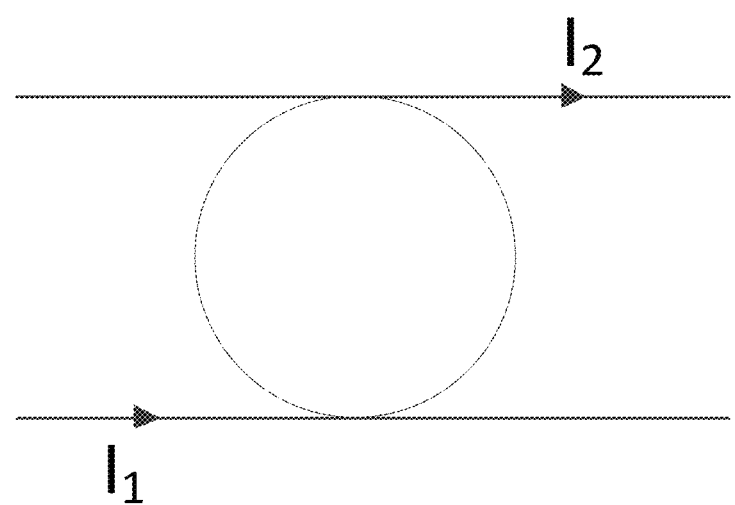
FIG. 6 is a schematic diagram of structure of a photonic crystal resonant cavity according to the embodiment of this disclosure.
Figure 7:
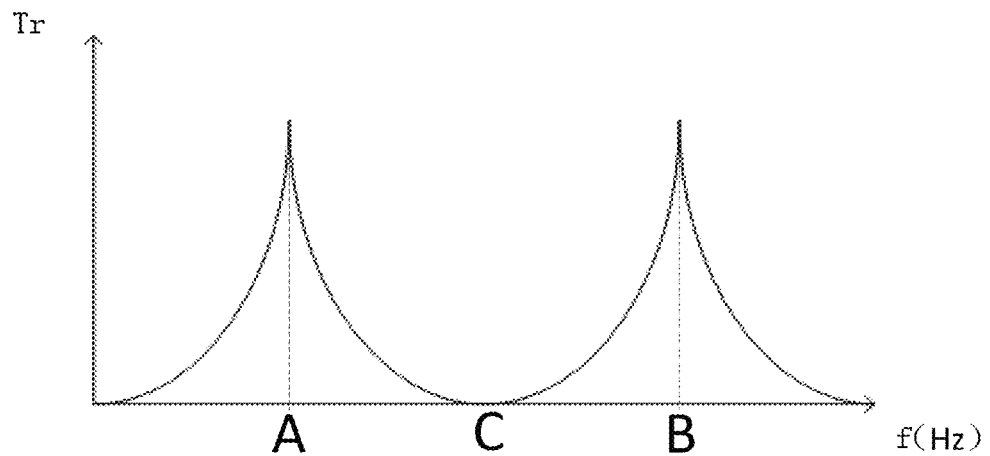
FIG. 7 is a curve of transmittance of photonic crystal resonant cavities in terms of light at different frequencies according to the embodiment of this disclosure.
Figure 8:
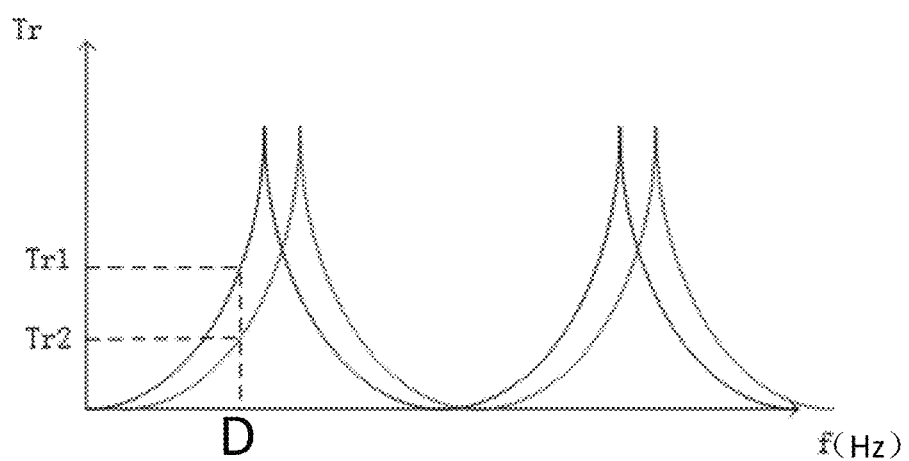
FIG. 8 is a curve of transmittance of photonic crystal resonant cavities in terms of light under different voltages at a same frequency according to the embodiment of this disclosure.

FIG. 5 illustrates a schematic diagram of structure of the photonic crystal film 03 according to the implementation mode of embodiment of this disclosure, where the photonic crystal film 03 includes the photonic crystal resonant cavity structures corresponding to the plurality of sub-pixels in a one-to-one manner. The left figure in FIG. 5 is a schematic diagram of a photonic crystal resonant cavity, and the right figure in FIG. 5 is a schematic diagram of a magnified part of the photonic crystal resonant cavity. Black dots in FIG. 5 are hollow, and other parts without the black dots form the resonant cavity. According to the implementation mode of the embodiment of this disclosure, light is incident on a part below the resonant cavity, and exits a part above the resonant cavity (as denoted by arrows). As illustrated by FIG. 6, the resonant cavity is an annular cavity, light $I_1$ is propagated around within the cavity, and is coupled to a straight path upon reaching a coupling point. When light coupled to the straight path is superimposed onto each other to form output light $I_2$, light emitted from the each sub-pixel is output through corresponding resonant cavities. Since the photonic crystal film 03 is made of piezoelectric material, when voltage is applied across the electrode layers on the two ends of the photonic crystal film 03, the photonic crystal film 03 is deformed, namely the photonic crystal resonant cavity is deformed, and then the length of the resonant cavity varies. The intensity of light emitted from each sub-pixel varies as the length of the corresponding photonic crystal resonant cavity varies. FIG. 7 illustrates a curve of transmittance Tr of the photonic crystal resonant cavities in in terms of light at frequency f, where the lengths of resonant cavities corresponding to points A and B are integer multiple(s) of the wavelengths of light in colors corresponding to the frequencies at the points A and B, respectively, and it can be seen that the transmittance at the points A and B are the largest. For example, the length of the resonant cavity corresponding to the point A is the wavelength of the light in the color corresponding to the frequency at point A, the length of the resonant cavity corresponding to the point B is twice the wavelength of the light in the color corresponding to the frequency at point B, and the length of the resonant cavity corresponding to the point C is 1.5 times of the wavelength of the light in the color corresponding to the frequency at point C. The transmittance drops from the point A to the point C, and rises from the point C to the point B, that is, when a length of a resonant cavity lies between two adjacent integer multiples of a wavelength of light in a color corresponding to the cavity, transmittance in terms of the light in the color drops and rises, and the transmittance is the highest only when the length of the resonant cavity is an integer multiple of the wavelength. FIG. 8 illustrates varying curves of the transmittance Tf of the photonic crystal resonant cavities in terms of light at frequency f. As illustrated by FIG. 8, the transmittance Tr in terms of light at a frequency having a value D is shifted because application of voltage causes a change of the length of the resonant cavity, and when the length of the resonant cavity changes, intensity of light exiting the resonant cavity changes. Generally, when different voltage is applied across the electrode layers, the lengths of the crystal resonant cavities vary accordingly, leading to changes of intensities of light exiting the crystal resonant cavities. Therefore, first voltage can be applied to the first electrode layer, and second voltage can be applied to the second electrode layer, according to predetermined correspondence relationships between a difference in voltage between the first electrode layer and the second electrode layer, and lengths of the photonic crystal resonant cavities, and according to correspondence relationships between the lengths of the photonic crystal resonant cavities and intensities of light exiting the pixel elements, so that the pixel elements emit light having pre-determined intensities.

In the display panel according to some implementation modes of the embodiment of this disclosure, as illustrated by FIG. 2, the first electrode layer 031 includes a plurality of first sub-electrodes 001 independent of each other, and corresponding to the plurality of sub-pixels in a one-to-one manner, and the second electrode layer 032 includes a plurality of second sub-electrodes 002 independent of each other, and corresponding to the plurality of sub-pixels in a one-to-one manner.

In the display panel according to some other implementation modes of the embodiment of this disclosure, as illustrated by FIG. 3, the first electrode layer 031 includes a plurality of first sub-electrodes 001 which are independent of each other and are corresponding to the plurality of sub-pixels in a one-to-one manner, and the second electrode layer 032 is a planar electrode. As such, a process of forming the second electrode layer 032 can be dispensed with, and only the first electrode layer 031 needs to be formed by forming the sub-electrodes 001 independent of each other. That is, the second electrode layer 032 is shared by the red photonic crystal resonant cavity, the green photonic crystal resonant cavity, and the blue photonic crystal resonant cavity, and corresponding voltages can be applied to the first sub-electrodes 001 in the first electrode layer 031 corresponding to the resonant cavities corresponding to different colors so that light is emitted at different intensities.

In the display panel according to still some other implementation modes of the embodiment of this disclosure, as illustrated by FIG. 4, the second electrode layer 032 includes a plurality of second sub-electrodes 002 independent of each other, and corresponding to the plurality of sub-pixels in a one-to-one manner, and the first electrode layer 031 is a planar electrode. As such, a process of forming the first electrode layer 031 can be dispensed with, and only the second electrode layer 032 needs to be formed by forming the sub-electrodes 002 independent of each other. That is, the first electrode layer 031 is common to the red photonic crystal resonant cavity, the green photonic crystal resonant cavity, and the blue photonic crystal resonant cavity, and corresponding voltages can be applied to the second sub-electrodes 002 in the second electrode layer 032 corresponding to the resonant cavities corresponding to different colors so that light is emitted at different intensities.

Figure 9:
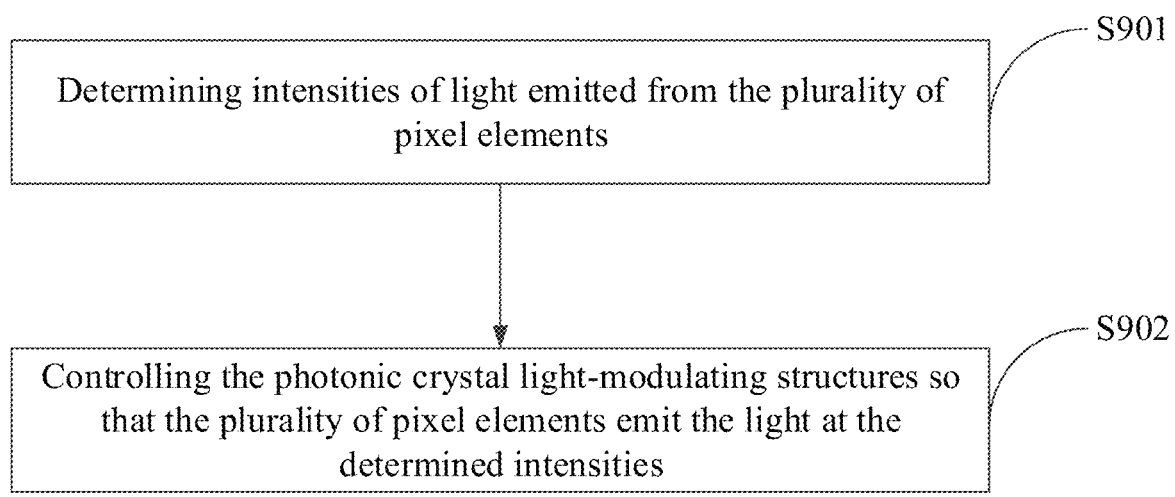
FIG. 9 is a flow chart of a method for driving a display panel according to another embodiment of this disclosure.

Based upon the same inventive conception, as illustrated by FIG. 9, the embodiment of this disclosure further provides a method for driving the display panel above. The method includes following operations S901 and S902.

The operation S901 includes determining intensities of light emitted from the plurality of pixel elements.

For example, each of the plurality of pixel elements includes a red sub-pixel, a green sub-pixel, and a blue sub-pixel, and intensities of light to be emitted from each sub-pixel are determined.

The operation S902 includes controlling the photonic crystal light-modulating structures so that the plurality of pixel elements emit the light at the determined intensities.

For example, after an intensity of light to be emitted from a red sub-pixel is determined, a corresponding photonic crystal light-modulating structure may be controlled so that the red sub-pixel emits the light at the determined intensity.

In the method for driving the display panel according to some implementation modes of the embodiment of this disclosure, each of the plurality of pixel elements further includes a plurality of sub-pixels in different colors, the photonic crystal light-modulating structure includes a first electrode layer, a second electrode layer, and a photonic crystal film between the first electrode layer and the second electrode layer. Material of the photonic crystal film includes piezoelectric material. At least one of the first electrode layer and the second electrode layer includes a plurality of sub-electrodes, where the plurality of sub-electrodes are corresponding to the plurality of sub-pixels and are arranged independent of each other. The photonic crystal film includes a plurality of photonic crystal resonant cavities corresponding to the plurality of sub-pixels in a one-to-one manner. Controlling the photonic crystal light-modulating structures so that the plurality of pixel elements emit the light at the determined intensities includes: for each of the photonic crystal light-modulating structures: determining correspondence relationships between lengths of the plurality of photonic crystal resonant cavities comprised by the photonic crystal light-modulating structure and intensities of light emitted from the pixel element comprising the photonic crystal light-modulating structure; determining a difference in voltage between the first electrode layer and the second electrode layer comprised by the photonic crystal light-modulating structure according to the correspondence relationships; and applying a first voltage to the first electrode layer corresponding to the pixel element, and a second voltage to the second electrode layer corresponding to the pixel element, according to the difference in voltage between the first electrode layer and the second electrode layer, so that the pixel element emits light at the determined intensities.

Based upon the same inventive conception, the embodiment of this disclosure further provides a display device including the display panel according to the embodiment of this disclosure. The display device can address the problem under a similar principle to the display panel above, so reference can be made to the implementation of the display panel above for the implementation of the display device, and a repeated description thereof is omitted here.

In the display panel, the method for driving the same, and the display device according to the embodiment of this disclosure, the display panel includes a first substrate and a second substrate arranged opposite each other, and a plurality of pixel elements located between the first substrate and the second substrate, where each of the plurality of pixel elements includes a photonic crystal light-modulating structure. In the display panel according to the embodiment of this disclosure, the photonic crystal light-modulating structures are arranged in the pixel elements, and by controlling the photonic crystal light-modulating structures, intensities of light to be emitted from the plurality of pixel elements are controlled, so that the photonic crystal light-modulating structures can take the place of the liquid crystal layer in the prior art to avoid the problem that the liquid crystal molecules may not resume their original states after they have deflected to a certain angle for a long time, resulting in an afterimage which hinders the image from being displayed normally.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A display panel, comprising:
a first substrate and a second substrate arranged opposite each other; and
a plurality of pixel elements located between the first substrate and the second substrate;
wherein each of the plurality of pixel elements comprises:
a photonic crystal light-modulating structure; and
a plurality of sub-pixels in different colors;
wherein the photonic crystal light-modulating structure comprises:
a first electrode layer,
a second electrode layer, and
a photonic crystal film between the first electrode layer and the second electrode layer;
wherein material of the photonic crystal film comprises piezoelectric material;
at least one of the first electrode layer and the second electrode layer comprises a plurality of sub-electrodes independent of each other and arranged corresponding to the plurality of sub-pixels in a one-to-one manner;
the photonic crystal film comprises a plurality of photonic crystal resonant cavities corresponding to the plurality of sub-pixels in a one-to-one manner; and
the photonic crystal light-modulating structure is configured so that lengths of the plurality of photonic crystal resonant cavities are adjusted according to a difference in voltage between the first electrode layer and the second electrode layer.

2. The display panel according to claim 1, wherein each of the plurality of pixel elements comprises a red sub-pixel, a green sub-pixel, and a blue sub-pixel; and
the plurality of photonic crystal resonant cavities comprise a red photonic crystal resonant cavity corresponding to the red sub-pixel, a green photonic crystal resonant cavity corresponding to the green sub-pixel, and a blue photonic crystal resonant cavity corresponding to the blue sub-pixel.

3. The display panel according to claim 1, wherein the piezoelectric material comprises barium titanate, lead zirconate titanate, lead metaniobate, or lead barium solium lithium niobate.

4. The display panel according to claim 1, wherein each of the plurality of sub-pixels comprises a color filter sheet located between the first substrate and the second substrate.

5. The display panel according to claim 4, further comprising a backlight source located on a side of the first or second substrate away from the pixel elements.

6. The display panel according to claim 1, wherein for each of the plurality of photonic crystal resonant cavities, a length of the photonic crystal resonant cavity is an integer multiple of a wavelength of light emitted from its corresponding sub-pixel.

7. The display panel according to claim 6, wherein the photonic crystal resonant cavities are annular photonic crystal resonant cavities.

8. The display panel according to claim 1, wherein for each of the plurality of photonic crystal resonant cavities, a length of the photonic crystal resonant cavity is an odd multiple of a half of a wavelength of light emitted from its corresponding sub-pixel.

9. The display panel according to claim 8, wherein the photonic crystal resonant cavities are annular photonic crystal resonant cavities.

10. The display panel according to claim 1, wherein when the first electrode layer comprises a plurality of sub-electrodes independent of each other and corresponding to the plurality of sub-pixels in a one-to-one manner, the second electrode layer is a planar electrode.

11. The display panel according to claim 1, wherein when the second electrode layer comprises a plurality of sub-electrodes independent of each other and corresponding to the plurality of sub-pixels in a one-to-one manner, the first electrode layer is a planar electrode.

12. A display device, comprising the display panel according to claim 1.

13. A method for driving the display panel according to claim 1, comprising:
determining intensities of light emitted from the plurality of pixel elements; and
controlling the photonic crystal light-modulating structures so that the plurality of pixel elements emit the light at the determined intensities.

14. The driving method according to claim 13, wherein each of the plurality of pixel elements further comprises a plurality of sub-pixels in different colors; the photonic crystal light-modulating structure comprises a first electrode layer, a second electrode layer, and a photonic crystal film between the first electrode layer and the second electrode layer; material of the photonic crystal film comprises piezoelectric material; at least one of the first electrode layer and the second electrode layer comprises a plurality of sub-electrodes corresponding to the plurality of sub-pixels and arranged independent of each other; the photonic crystal film comprises a plurality of photonic crystal resonant cavities corresponding to the plurality of sub-pixels in a one-to-one manner; and
controlling the photonic crystal light-modulating structures so that the plurality of pixel elements emit light at the determined intensities comprises:
for each of the photonic crystal light-modulating structures:
determining correspondence relationships between lengths of the plurality of photonic crystal resonant cavities comprised by the photonic crystal light-modulating structure and intensities of light emitted from the pixel element comprising the photonic crystal light-modulating structure;
determining a difference in voltage between the first electrode layer and the second electrode layer comprised by the photonic crystal light-modulating structure according to the correspondence relationships; and
applying a first voltage to the first electrode layer corresponding to the pixel element, and a second voltage to the second electrode layer corresponding to the pixel element, according to the difference in voltage between the first electrode layer and the second electrode layer, so that the pixel element emits light at the determined intensities.

15. The display panel according to claim 1, wherein the photonic crystal resonant cavities are annular photonic crystal resonant cavities.

* * * * *